United States Patent [19]

Morita et al.

[11] Patent Number: 5,012,201

[45] Date of Patent: Apr. 30, 1991

[54] VARIABLE IMPEDANCE CIRCUIT

[75] Inventors: Yoichi Morita, Moriyama; Hiroshi Komori, Takatsuki; Akio Yokoyama, Nagaokakyo, all of Japan

[73] Assignee: Matsushita Electric Industrial Co., Ltd., Osaka, Japan

[21] Appl. No.: 426,229

[22] Filed: Oct. 25, 1989

[30] Foreign Application Priority Data

Oct. 25, 1988 [JP] Japan .............................. 63-268430
May 16, 1989 [JP] Japan .............................. 1-120354

[51] Int. Cl.[5] ..................... H03F 3/45; H03H 11/00
[52] U.S. Cl. ..................................... 330/252; 333/214
[58] Field of Search ............... 307/494, 520; 330/252; 333/213-217

[56] References Cited

PUBLICATIONS

"Integrated Gyrator Replaces Filter Inductances," *Telecommunication-Journal*, vol. 43, No. 4, p. 323, Apr. 1976.
Voorman et al, "Integration of Analog Filters in a Bipolar Process," *IEEE Journal of Solid-State Circuits*, vol. SC-17, No. 4, Aug. 1982, pp. 713-721.
Pookaiyaudom et al, "An Accurate Integrable Voltage-Variable Floating Gyrator," *IEEE Transactions on Instrumentation and Measurement*, vol. IM-29, No. 1, Mar. 1980, pp. 15-19.
Pookalyaudom et al, "Integrable Electronically Variable General-Resistance Converter-A Versatile Active Circuit Element," *IEEE Transactions on Circuits and Systems*, vol. CAS-25, No. 6, Jun. 1978, pp. 344-353.

*Primary Examiner*—James B. Mullins
*Attorney, Agent, or Firm*—Wenderoth, Lind & Ponack

[57]  ABSTRACT

A variable impedance circuit includes a first differential amplifier circuit having an input terminal pair, an output terminal pair and a capacitive element connected between the emitters of a transistor pair. The variable impedance circuit further inclludes a second differential amplifier circuit having an input terminal pair and an output terminal pair. The output terminal pair of the first differential amplifier circuit is connected to the input terminal pair of the second differential amplifier circuit. Furthermore, the output terminal pair of the second differential amplifier circuit is connected to the input terminal pair of the first differential amplifier circuit.

13 Claims, 9 Drawing Sheets

VARIABLE IMPEDANCE CIRCUIT

BACKGROUND OF THE INVENTION

This invention relates to a variable impedance circuit capable of electrically increasing or decreasing the impedance, such as resistance and capacitance.

Recently, the function of semiconductor integrated circuits has been greatly improved, and the filter circuit has come to be incorporated in a semiconductor chip as an integrated circuit. Generally a filter circuit is composed of a resistance element and a capacitance element. To change the filtering characteristic of the filter circuit, it is necessary to vary the value of constituent elements, that is, the capacitance element or the resistance element. Accordingly, hitherto, a variable impedance circuit has been used, which can vary the value of capacitance element or resistance element built in a semiconductor chip.

FIG. 12 shows a conventional variable capacitance circuit used for such a purpose, expressed only by an AC circuit. In FIG. 13, the variable capacitance circuit in FIG. 12 is expressed by both an AC circuit and DC circuit.

In FIG. 12 and FIG. 13, a differential amplifier circuit 15 is composed of transistors $Q_5$, $Q_6$, and a resistance element 10 connected between their emitters. A differential amplifier circuit 16 is composed of transistors $Q_7$, $Q_8$, and a resistance element 11 connected between their emitters. A differential amplifier circuit 17 is composed of transistors $Q_1$, $Q_2$, and a resistance element 12 connected between their emitters. A differential amplifier circuit 18 is composed of transistors $Q_3$, $Q_4$, and a resistance element 13 connected between their emitters. As is clear from FIG. 12 and FIG. 13, the differential amplifier circuits 15, 16 are so connected that the input terminals of one differential amplifier circuit are connected to the output terminals of the other differential amplifier circuit. The differential amplifier circuits 17, 18 are also connected in a similar relation. These differential amplifier circuits 15, 16, 17 and 18 are connected as shown in FIG. 12, FIG. 13, and a capacitance element 14 is connected between two output terminals of the differential amplifier circuit 17. The transistors $Q_1$ to $Q_8$ for composing the differential amplifier circuits 15, 16, 17 and 18 are supplied with biases from voltage sources $V_0$, $V_1$, and constant current source $I_0$ as shown in FIG. 13.

The voltage-current conversion factors of the differential amplifier circuits 15, 16, 17 and 18 are determined respectively by the characteristics of the resistance elements 10, 11, 12 and 13.

The operation is explained below.
The relation $$i_2 = g_1 \cdot V_1 \tag{1}$$

is established between voltage $V_1$ and output current $i_2$ across input terminals of the differential amplifier circuit 17. In this equation $g_1$ denotes the voltage-current conversion factor of the differential amplifier circuit 17, and supposing the emitter resistance value of transistors $Q_1$, $Q_2$ to be $r_{e1}$, and the value of resistance element 12 between emitters to be $R_1$, $g_1$ it is expressed as follows.

$$g_1 = \frac{1}{R_1 + 2r_{e1}} \tag{2}$$

The characteristics of voltage $V_2$ and current $i_2$ occurring at both ends of the capacitance element 14 of capacitance value $C_0$ are obtained as follows.

$$i_2 = -j\omega C_0 \cdot V_2 \tag{3}$$

Similarly, the characteristics of voltage $V_2$ across input terminals and output current $i_1$ of the differential amplifier circuit 18 composed of transistors $Q_3$, $Q_4$ are obtained as follows:

$$i_1 = -g_2 \cdot V_2 \tag{4}$$

where $g_2$ denotes the voltage-current conversion factor of the differential amplifier circuit 18, and supposing the resistance value of each emitter of transistors $Q_3$, $Q_4$ to be $r_{e2}$, and the value of the resistance element 13 between the emitters to be $R_2$, $g_2$ is expressed as follows.

$$g_2 = \frac{1}{R_2 + 2r_{e2}} \tag{5}$$

Solving $V_1$ and $i_1$ from equations (1), (3) and (4), it is known from equations (1), (3) that $$V_2 = -\frac{g_1 \cdot V_1}{j\omega C_0} \tag{6}$$

and from equations (4), (6) that $$i_1 = \frac{g_1 \cdot g_2 \cdot V_1}{j\omega C_0} \tag{7}$$

That is, $$V_1 = j\omega \left( \frac{C_0}{g_1 \cdot g_2} \right) i_1 \tag{8}$$

Here, the inductance L is given as follows.

$$L = \frac{C_0}{g_1 \cdot g_2} \tag{9}$$

Furthermore, from equations (2), (5), it follows that $$L = (R_1 + 2r_{e1})(R_2 + 2r_{e2})C_0 \tag{10}$$

Usually, the resistance values can be set so as to establish the relation of $R_1 > r_{e1}$, $R_2 > r_{e2}$, and hence the inductance L can be approximated as $$L = R_1 \cdot R_2 \cdot C_0$$

Likewise, the characteristics of input terminal voltage $V_3$ and output current $i_4$ of the differential amplifier circuit 15 composed of transistors $Q_5$, $Q_6$ may be expressed as follows, supposing the voltage-current conversion factor of the differential amplifier circuit 15 to be $g_3$:

$$i_4 = g_3 \cdot V_3 \tag{11}$$

Supposing the voltage-current conversion factor of the differential amplifier circuit 16 to be $g_4$, the characteristics of input terminal voltage $V_4$ and output current $i_3$ of the differential amplifier 16 composed of transistors $Q_7$, $Q_8$ are as follows.

$$i_3 = -g_4 \cdot V_4 \tag{12}$$

The circuit systems respectively composed of the differential amplifier circuits 15, 16, and the differential amplifier circuits 17, 18 represent the conventionally used phase conversion circuits. The circuit system composed of the differential amplifiers 17, 18 is designed to apply from capacitance characteristics to inductance characteristics, in terms of circuitry.

In FIG. 12 and FIG. 13, the relations $$V_4 = V_1 \tag{13}$$

$$i_4 = -i_1 \tag{14}$$

are established between the voltages $V_1$, $V_4$, and currents $i_4$, $i_1$, respectively. Hence, equation (8) is rewritten as $$V_4 = j\omega \cdot \frac{C_0}{g_1 \cdot g_2} (-i_4) \tag{15}$$

and further by eliminating $i_4$ from equation (11), it results in $$V_4 = j\omega \cdot \frac{C_0}{g_1 \cdot g_2} (-g_3 \cdot V_3) \tag{16}$$

and from equations (16) and (12), it follows that $$i_3 = j\omega \cdot \frac{g_3 \cdot g_4}{g_1 \cdot g_2} C_0 \cdot V_3 \tag{17}$$

The capacitance value C applied between the voltage $V_3$ and current $i_3$ is given as $$C = \frac{g_3 \cdot g_4}{g_1 \cdot g_2} C_0 \tag{18}$$

That is, by properly selecting the values for the voltage-current conversion factors $g_1$, $g_2$, $g_3$ and $g_4$, the capacity value C is newly created electrically.

However, in the conventional variable capacitance circuit shown in FIG. 12, FIG. 13, at least four differential amplifier circuits are needed in order to obtain a new capacitance value by electrically increasing or decreasing the capacitance. Accordingly, the circuit composition is complicated, the number of required elements increases, and the chip area increases.

A conventional variable resistance circuit incorporated in a semiconductor chip is explained below while referring to FIG. 14.

In FIG. 14, transistors 41, 42 are connected between a constant voltage source 40 and the grounding potential. A constant voltage source 43 is connected to the base of the transistor 41. A variable voltage source 44 is connected to the base of the transistor 42. An output terminal 45 is connected to the connecting points of the transistors 41, 42.

In the structure in FIG. 14, the resistance value as seen from the output terminal 45 is equal to the differential emitter resistance of the transistor 41 (that is, the impedance of the transistor 41 seen from its emitter), and it is given in the following formula.

$$\frac{kT/q}{I_0}$$

where k is Boltzmann constant, T is absolute temperature, q is electric charge quantity of an electron, and $I_0$ is emitter current flowing in the transistor 41. When the voltage of the variable voltage source 44 is varied, the current $I_0$ changes, and hence the resistance value as seen from the output terminal 45 varies. Therefore, by controlling the voltage of the variable voltage source 44, a variable resistance may be obtained.

However, in the conventional variable resistance circuit shown in FIG. 14, since the differential emitter resistance itself of the transistor 41 is used as a variable resistance component, the variable range of the resistance value is narrow.

SUMMARY OF THE INVENTION

It is hence a first object of the invention to present a variable impedance circuit capable of varying the impedance, such as capacitance value and resistance value, by using two differential amplifier circuits.

It is a second object of the invention to present a variable impedance circuit capable of widening the variable range of impedance, such as capacitance value and resistance value.

The invention is, in short, intended to obtain a new impedance from the voltage and current characteristics caused between the pair of input terminals of a first differential amplifier circuit, by connecting the output terminal pair of the first differential amplifier circuit to the input terminal pair of a second differential amplifier circuit, connecting the output terminal pair of the second differential amplifier cirucuit to the input terminal pair of the first differential amplifier circuit, and connecting an impedance element such as capacitance element or resistance element between the emitters of the transistor pair composing the first differential amplifier circuit.

In this way, the variable impedance circuit is composed of two differential amplifier circuits, and the circuit composition may be simplified, and the number of required elements is smaller. Therefore, when this variable impedance circuit is incorporated in a semiconductor chip, the required chip area may become small. Moreover, as compared with the prior art in which differential emitter resistance is directly used as variable resistance component, the variable range of the impedance may become greater.

DETAILED DESCRIPTION OF THE INVENTION

Figure 1:
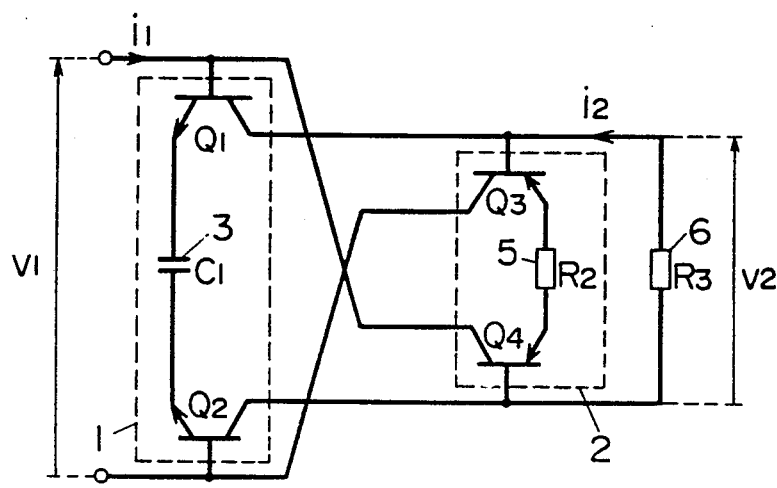
FIG. 1 is a circuit diagram expressing a variable impedance circuit in a first embodiment of the invention only by an AC circuit.
Figure 2:
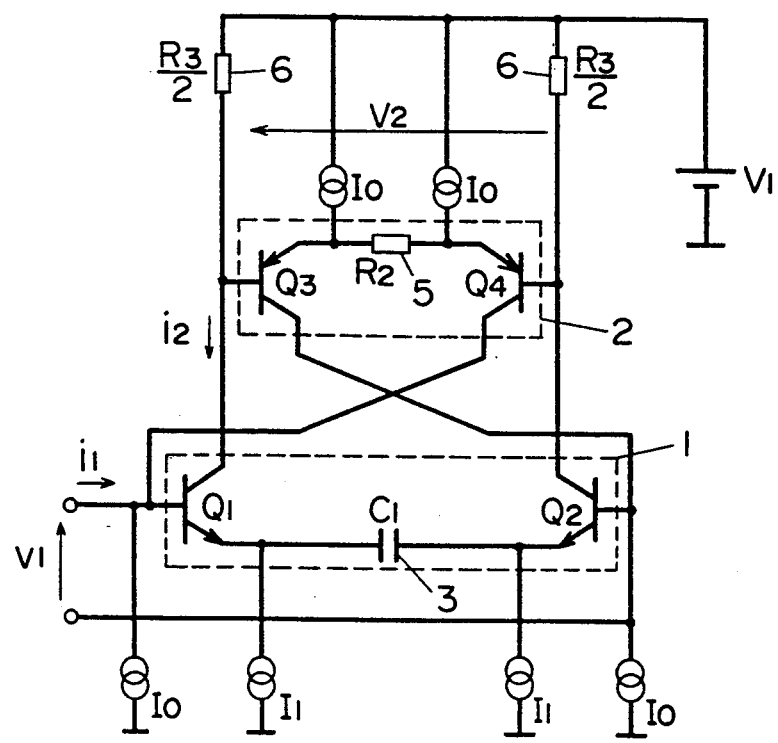
FIG. 2 is a circuit diagram expressing the first embodiment by both an AC circuit and DC circuit.

Referring now to FIG. 1 and FIG. 2, a first embodiment of the invention is described in detail below.

In FIG. 1, FIG. 2, a differential amplifier 1 is composed of transistors $Q_1$, $Q_2$, and a capacitance element 3 connected between their emitters. A differential amplifier circuit 2 is composed of transistors $Q_3$, $Q_4$, and a resistance element 5 connected between their emitters. The output terminal pair of the differential amplifier circuit 1 is connected to the input terminal pair of the differential amplifier circuit 2. The output terminal pair of the differential amplifier circuit 2 is connected to the input terminal pair of the differential amplifier circuit 1. A resistance element 6 is connected between the input terminals of the differential amplifier circuit 2. Biases are supplied to the transistors $Q_1$ to $Q_4$ from voltage source $V_1$, and constant current sources $I_0$, $I_1$.

The operation is explained below.

Supposing the input terminal AC voltage of the differential amplifier circuit 1 to be $V_1$, and the voltage-current conversion factor of the differential amplifier circuit 1 to be $g_{m1}$, the output AC current $i_2$ is given as $$i_2 = g_{m1} \cdot V_1 \qquad (19)$$

The voltage $V_2$ produced between the both ends of the resistance element 6 of which resistance value is $R_3$ is given as $$V_2 = -i_2 \cdot R_3 \qquad (20)$$

Supposing the voltage-current conversion factor of the differential amplifier circuit 2 to be $g_{m2}$, the output current $i_1$ flowing due to the voltage $V_2$ applied between the input terminals of the differential amplifier circuit 2 is given as $$i_1 = -g_{m2} \cdot V_2 \qquad (21)$$

From equations (19), (20), it follows that $$V_2 = -g_{m1} \cdot R_3 \cdot V_1 \qquad (22)$$

From equations (22), (21), it follows that $$i_1 = g_{m1} \cdot g_{m2} \cdot R_3 \cdot V_1 \qquad (23)$$

Here, the voltage-current conversion factor $g_{m2}$ of the differential amplifier circuit 2 is given by the resistance characteristic. In other words, the voltage-current conversion factor $g_{m2}$ is determined by the emitter resistance value $r_{e2}$ of transistors $Q_3$, $Q_4$ and the resistance value $R_2$ of the resistance element 5, and is obtained as follows.

$$g_{m2} = \frac{1}{R_2 + 2r_{e2}}$$

Supposing here $r_{e2} < < R_2$, it follows that $$g_{m2} = \frac{1}{R_2} \qquad (24)$$

Next, the voltage-current conversion factor $g_{m1}$ of the differential amplifier circuit 1 is given by the characteristics of the capacitance element 3. Here, the voltage-current conversion factor $g_{m1}$ is given by the impedance of the capacitance element 3

$$Z = \frac{1}{j\omega C_1}$$

and the emitter resistance value $r_{e1}$ of the transistors $Q_1$, $Q_2$, and it becomes $$g_{m1} = \frac{1}{Z + 2r_{e1}}$$

Here, if selecting as $2r_{e1} < < |Z|$, it follows that $$g_{m1} = \frac{1}{Z} \qquad (25)$$

$$= j\omega C_1 \qquad (26)$$

Putting equations (24), (26) into equation (23) yields $$i_1 = j\omega C_1 \cdot \frac{R_3}{R_2} \cdot V_1 \qquad (27)$$

As a result, between the voltage $V_1$ and current $i_1$, a new capacitance value C is given as $$C = \frac{R_3}{R_2} \cdot C_1 \qquad (28)$$

By selecting the ratio of the resistance value $R_3$ and $R_2$, another new capacitance value C may be obtained from the original capacitance value $C_1$.

Furthermore, as seen from equation (23), it is enough when the capacitance characteristic is given to either one of the voltage-current conversion factor $g_{m1}$ or $g_{m2}$.

Figure 3:
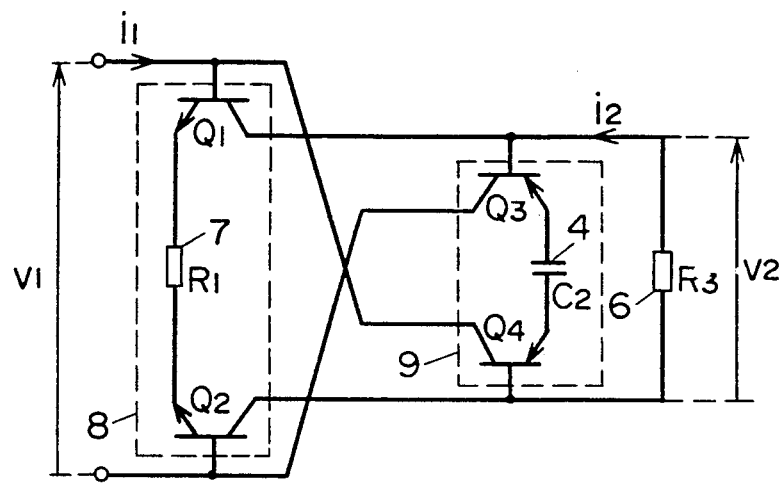
FIG. 3 is a circuit diagram expressing a variable impedance circuit in a second embodiment of the invention only by an AC circuit.
Figure 4:
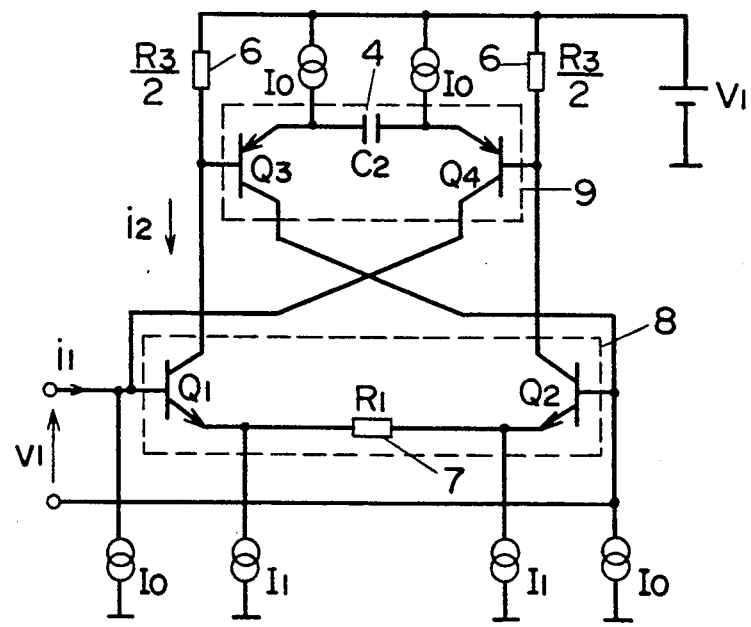
FIG. 4 is a circuit diagram expressing the second embodiment by both an AC circuit and DC circuit.

FIG. 3 and FIG. 4 relate to a second embodiment of the invention. The variable impedance circuit shown in FIG. 3, FIG. 4 comprises differential amplifier circuits 8, 9, and a resistance element 7 is connected between the emitters of transistors $Q_1$, $Q_2$ for composing the differential amplifier circuit 8, and a capacitance element 4 is connected between the emitters of transistors $Q_3$, $Q_4$ for composing the differential amplifier circuit 9. The remaining composition is the same as in the first embodiment shown in FIG. 1, FIG. 2.

Now, assuming the capacitance value of the capacitance element 4 to be $C_2$ and the resistance value of the reistance element 7 to be $R_1$, equations (26), (24) in the first embodiment are respectively rewritten as $$g_{m2} = j\omega C_2 \tag{29}$$

$$g_{m1} = \frac{1}{R_1} \tag{30}$$

and the current $i_1$ becomes $$i_1 = j\omega C_2 \cdot \frac{R_3}{R_1} \cdot V_1 \tag{31}$$

That is, same as in the first embodiment, a new capacitance value C is applied between the voltage $V_1$ and current $i_1$ as $$C = \frac{R_3}{R_1} \cdot C_2$$

Therefore, by selecting the ratio of the resistance value $R_3$ and $R_1$, a new capacitance value C may be obtained from the initial capacity value $C_2$.

Figure 5:
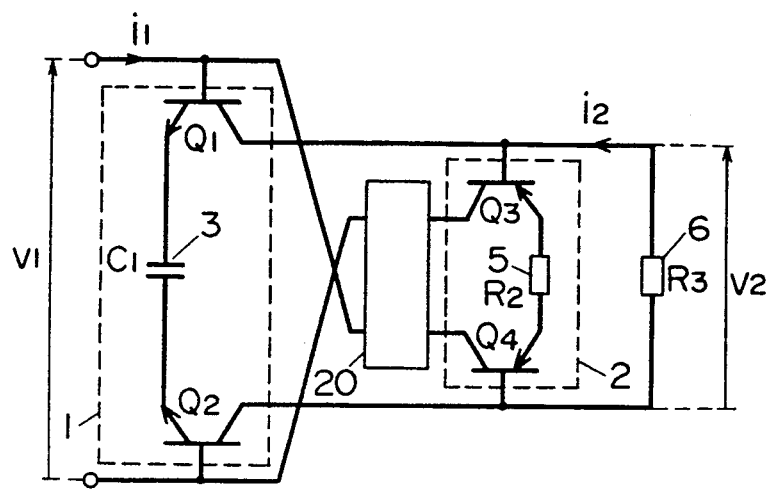
FIG. 5 is a circuit diagram expressing a variable impedance circuit in a third embodiment of the invention only by an AC circuit.
Figure 6:
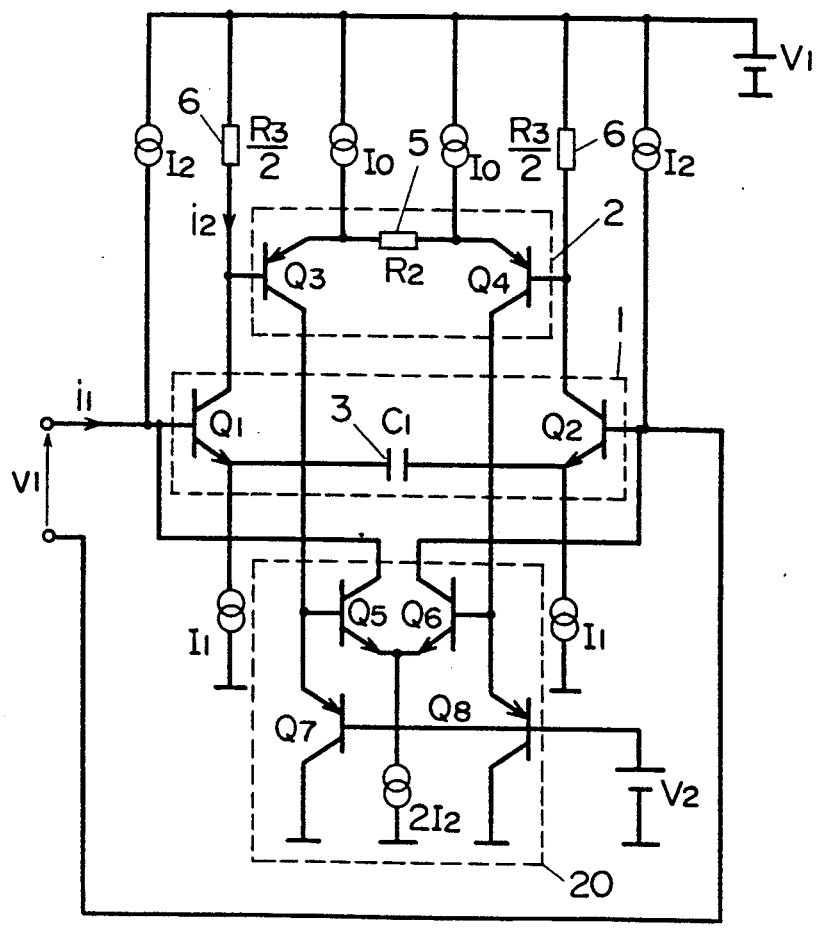
FIG. 6 is a circuit diagram expressing the third embodiment by both an AC circuit and DC circuit.

FIG. 5 and FIG. 6 relate to a third embodiment of the invention. In this embodiment, as clearly seen from FIG. 5, the output terminal pair of the differential amplifier circuit 2 is connected to the input terminal pair of the differential amplifier circuit 1 by way of a current-current conversion circuit 20. The current-current conversion circuit 20 may be realized, for example as shown in FIG. 6, by a known Gilbert multiplication circuit composed of transistors $Q_5$ to $Q_8$, and current source $2I_2$. Meanwhile, to the transistors $Q_7$, $Q_8$ of the current-current conversion circuit 20, a base bias is applied from a voltage source $V_2$. The remaining composition is substantially the same as shown in FIG. 2, FIG. 4.

When such current-current conversion circuit 20 is used, the current value of the differential amplifier circuit 2 may be varied independently of the composition of the differential amplifier circuit 2. In other words, supposing there is a coefficient K for converting current $i_1$ into other current $i_1'$, the relation is $$i_1' = K \cdot i_1 \tag{32}$$

Putting equation (32) into equation (27), the converted current $i_1'$ is expressed as $$i_1' = K \cdot j\omega C_1 \frac{R_3}{R_2} \cdot v_1 \tag{33}$$

Therefore, the capacitance value C' after conversion is $$C' = K \frac{R_3}{R_2} C_1 \tag{34}$$

As known from equation (34), the new capacitance value C' may be increased or decreased by the quantity given as the product of K and $R_3/R_2$. Since K is determined by $I_2/I_0$, equation (34) is finally rewritten as $$C' = \frac{I_2}{I_0} \cdot \frac{R_3}{R_2} \cdot C_1 \tag{35}$$

That is, according to the embodiment shown in FIG. 6, the capacitance value can be changed not only by the ratio of resistance components ($R_3/R_2$), but also by the ratio of current components ($I_2/I_0$). Therefore, a greater capacitance value may be obtained.

Figure 7:
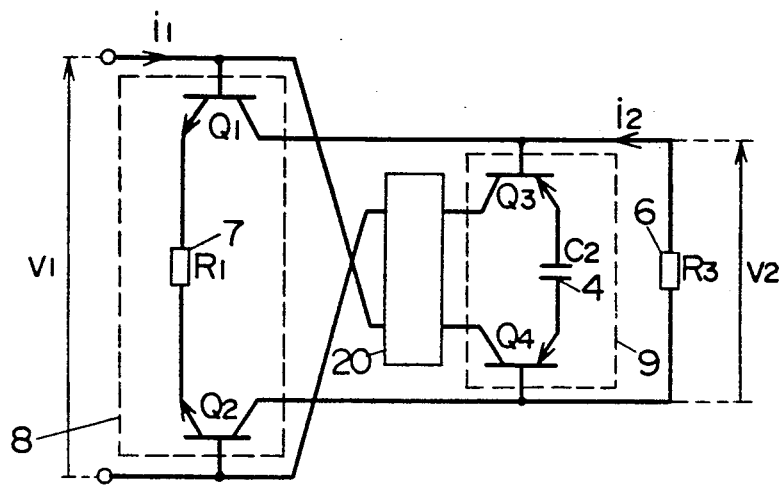
FIG. 7 is a circuit diagram expressing a variable impedance circuit in a fourth embodiment of the invention only by an AC circuit.

FIG. 7 shows a fourth embodiment of the invention, having a current-current conversion circuit 20 added to the embodiment in FIG. 3. In FIG. 7, the current value of the differential amplifier circuit 9 may also be varied independently of the composition of the differential amplifier circuit 9. In FIG. 7, the capacitance value C' after conversion is given as $$C' = K \frac{R_3}{R_1} C_2$$

When the current-current conversion circuit 20 is used as shown in the embodiments in FIG. 5 to FIG. 7, the following advantages are brought about. Since the resistance element and capacitance element of the variable impedance circuit of the invention are formed in a semiconductor chip, their values are fixed. However, when actually composing a filter circuit by using this variable impedance circuit, it may be sometimes desired to vary the frequency characteristics of the filter only very slightly. In such a case, by using the current-current conversion circuit 20, the filter circuit may be furnished with a kind of a variable resistor function, so that a desired frequency characteristic may be realized quite easily.

Figure 8:
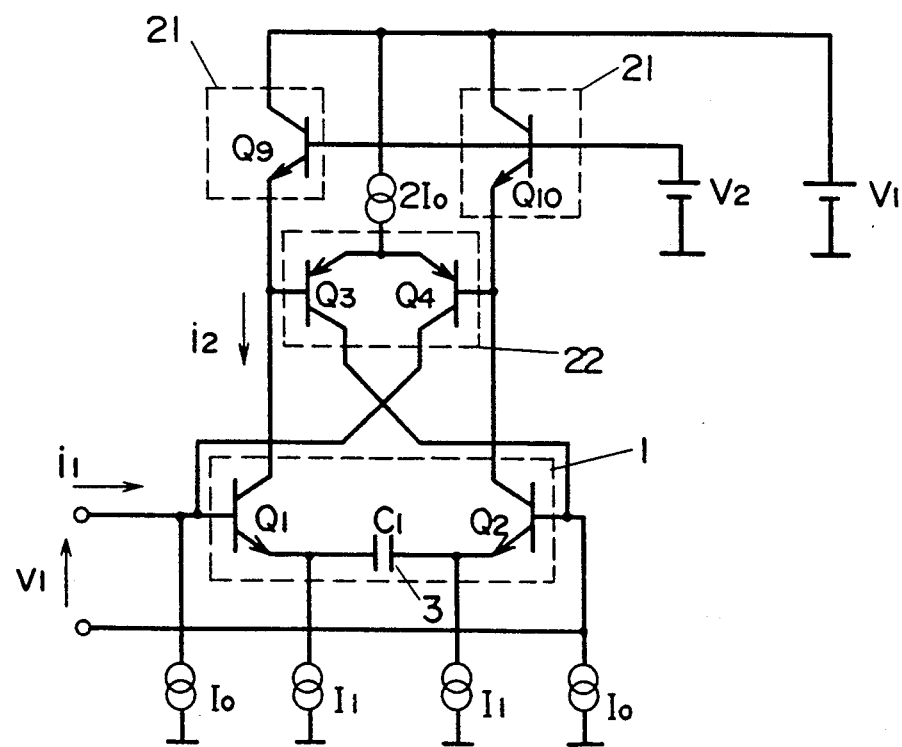
FIG. 8 is a circuit diagram expressing the fifth embodiment by both an AC circuit and DC circuit.

FIG. 8 shows a fifth embodiment of the invention modifying the embodiment shown in FIG. 6. That is, instead of the linear resistance elements 6, 6 in FIG. 6, nonlinear characteristic resistances 21, 21 composed of transistors $Q_9$, $Q_{10}$ are used, and a base bias is applied to these transistors $Q_9$, $Q_{10}$ from a voltage source $V_2$. Meanwhile, in the composition in FIG. 8, a resistance element is not connected between the emitters of the transistors $Q_3$, $Q_4$ for composing a differential amplifier circuit 22.

In the embodiment shown in FIG. 8, the transistors $Q_9$, $Q_{10}$, the transistors $Q_3$, $Q_4$ for composing the differential amplifier circuit 22, and the current source $2I_0$ fulfill substantially an equivalent current-current converting function as the Gilbert multiplication circuit 20 shown in FIG. 6. Accordingly, the current-current converting function is realized in a simple circuit structure. Moreover, when composed as shown in FIG. 8, since the base potentials of the transistors $Q_9$, $Q_{10}$ are fixed by the potential of the voltage source $V_2$, the emitter potentials of the transistors $Q_3$, $Q_4$ for composing the differential amplifier circuit 22 are also fixed nearly at specific potentials. Therefore, particularly when the supply voltage is small, the circuit design becomes quite easy, and the dynamic range of the transistors $Q_1$, $Q_2$ for composing the differential amplifier circuit 1 may be increased.

Figure 9:
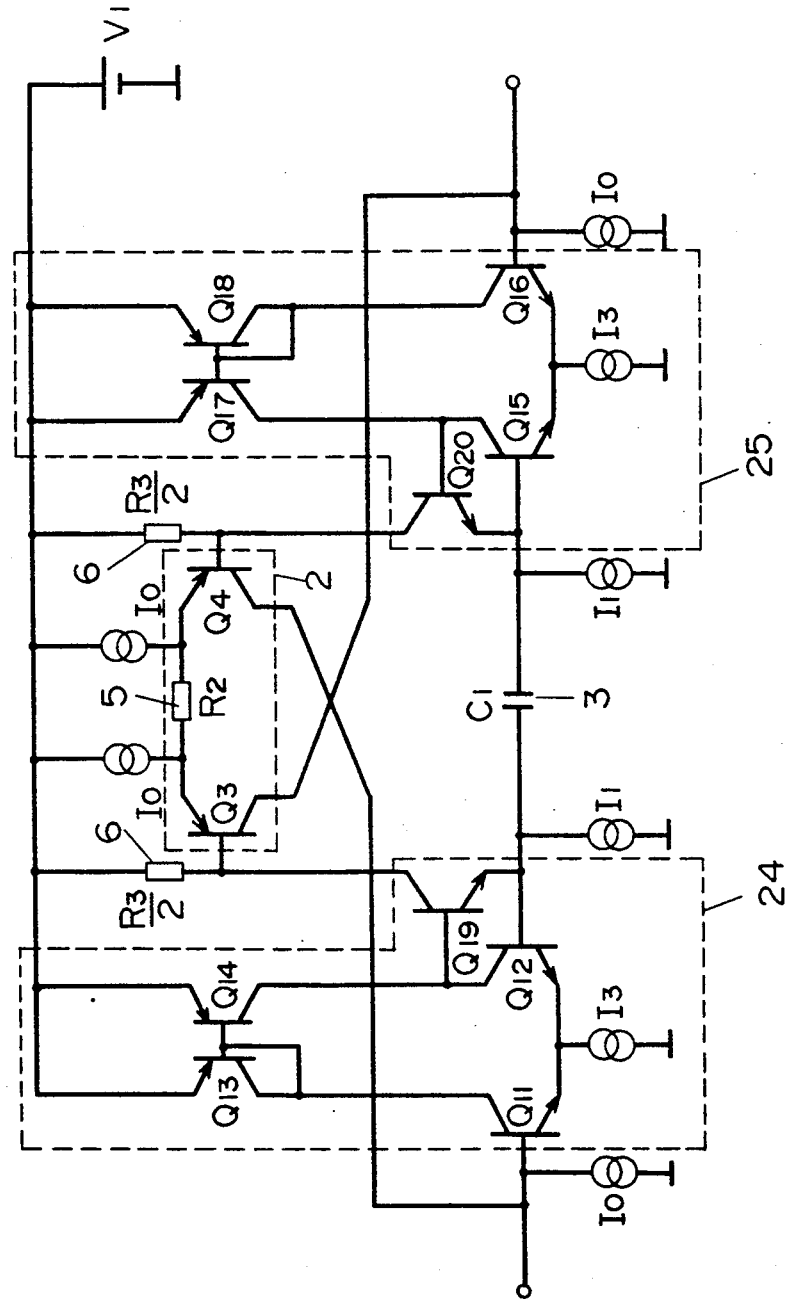
FIG. 9 is a circuit diagram of a variable impedance circuit in a sixth embodiment of the invention modified from the embodiment shown in FIG. 2, expressed by both an AC circuit and DC circuit.

FIG. 9 shows a sixth embodiment shown of the invention, improving the embodiment in FIG. 2. Instead of the transistor $Q_1$ in FIG. 2, an operational amplifier 24 is used, and instead of transistor Q₂ in FIG. 2, an operational amplifier 25 is used. The operational amplifier 24 is composed of transistors $Q_{11}$ to $Q_{14}$, $Q_{19}$, and a current source $I_3$, while the operational amplifier 25 is composed of transistors $Q_{15}$ to $Q_{18}$, $Q_{20}$, and a current source $I_3$.

By thus composing, the emitter resistances of the transistors $Q_{19}$, $Q_{20}$ become smaller in reverse proportion to the open gain of the operational amplifiers 24, 25. As a result, the resistance component added serially to the capacitance element 3 is decreased.

Figure 10:
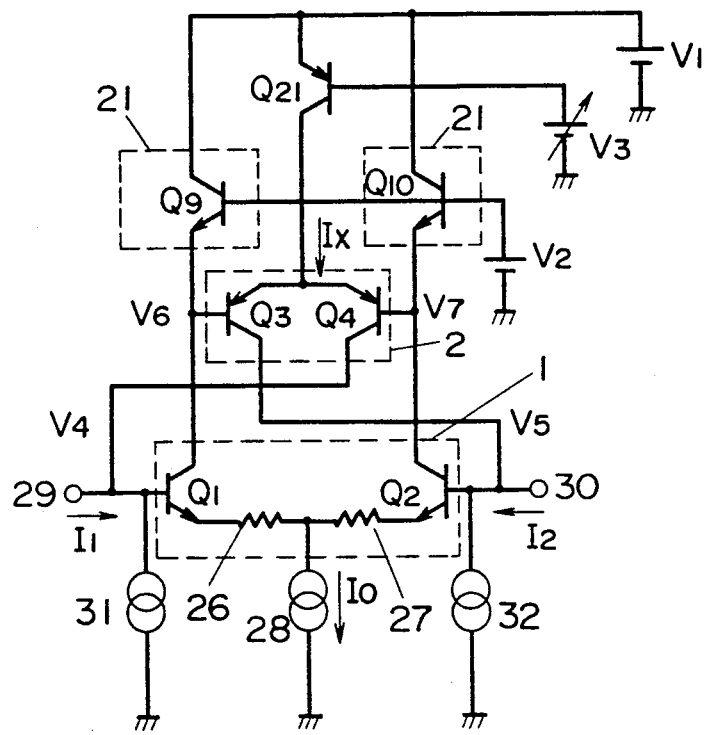
FIG. 10 is a circuit diagram expressing a variable impedance circuit in a seventh embodiment of the invention by both an AC circuit and DC circuit.

FIG. 10 shows an embodiment shown of the invention applied to a variable resistance circuit.

The embodiment in FIG. 10 is a modified version of the composition of FIG. 8, and the same parts are identified with the same reference numbers and repeated explanations are omitted. A transistor $Q_{21}$ and a variable voltage source $V_3$ make up a current source, and an electric current $I_x$ is supplied into the differential amplifier circuit 2. On the other hand, resistance element 26, 27 are connected in series between the emitters of the transistors $Q_1$, $Q_2$ for composing the differential amplifier circuit 1, and a constant current source 28 is connected between their connecting point and the reference potential.

Supposing the current flowing in the constant current source 28 to be $I_0$, the differential emitter resistance $r_{eN}$ of the transistros $Q_1$, $Q_2$, $Q_9$ and $Q_{10}$ is an expressed as follows:

$$r_{eN} = (KT/q)/(I_0/2) \quad (36)$$

where K is Boltzmann's constant, T is absolute temperature, and q is electric charge quantity of an electron. The potentials applied to input terminals 29 and 30 are supposed to be $V_4$ and $V_5$. When the potentials $V_4$ and $V_5$ are changed, the emitter current flowing in the transistors $Q_1$ and $Q_2$ varies. At the same time, the emitter current flowing in the transistors $Q_9$ and $Q_{10}$ varies, and accordingly the potentials $V_6$ and $V_7$ of the emitters of the transistors $Q_9$ and $Q_{10}$ are also changed. At this time, the rate of change of voltage $(V_7-V_6)$ to the voltage $(V_4-V_5)$, that is, the voltage amplification factor $G_N$ is given in the following equation:

$$G_N = d(V_6-V_7)/d(V_4-V_5) = r_{eN}/(r_{eN}+R) \quad (37)$$

where R is the resistance value of resistance elements 26 and 27, and it functions to increase the emitter series resistance of the transistors $Q_9$ and $Q_{10}$. Supposing the collector current of the transistor $Q_{21}$ to be $I_x$, each emitter current and collector current of the transistors $Q_3$ and $Q_4$ are $I_x/2$. Therefore, the differential emitter resistance $r_{ep}$ of the transistors $Q_3$ and $Q_4$ is given as follows:

$$r_{er} = (KT/q)/(I_x/2) \quad (38)$$

At this time, when the current value flowing in the constant current sources 31 and 32 is set at $I_x/2$, the current flowing in from the input terminals 29 and 30 becomes zero, which is very convenient. The rate of change of collector currents of the transistors $Q_3$ and $Q_4$ by the change of the voltage $(V_7-V_6)$ generated between the bases of the transistors $Q_3$ and $Q_4$, that is, the voltage-current conversion factor (mutual conductance) $g_{mp}$ is given as follows.

$$g_{mp} = 1/r_{ep} \quad (39)$$

The change of the collector current of transistors $Q_3$ and $Q_4$ is equal to the change of the currents $I_1$ and $I_2$ flowing in from the input terminals 29 and 30. Therefore, the rate of change of currents $I_1$ and $I_2$ by the changes of the potentials $V_4$ and $V_5$, $d(I_1-I_2)/d(V_4-V_5)$, is given as follows.

$$\begin{aligned} d(I_1 - I_2)/d(V_4 - V_5) &= g_{mp} \cdot G_N \\ &= r_{eN}/\{(r_{eN} + R) \cdot r_{ep}\} \end{aligned} \quad (40)$$

Futhermore, since the change of current $I_1$ and change of current $i_2$ are equal to each other, the resistance value seen from the input terminals 29 and 30, $d(V_4-V_5)/dI_1$ is expressed as follows.

$$\begin{aligned} d(V_4 - V_5)/dI_1 &= d(V_4 - V_5)/\tfrac{1}{2}d(I_1 - I_2) \\ &= \{2(r_{eN} + R)/r_{eN}\}r_{ep} \end{aligned} \quad (41)$$

As known from the equation (41), the value of the resistance is equal to the product of the differential emitter resistance $r_{ep}$ of transistors $Q_3$ and $Q_4$ multiplied by the coefficient $\{2(r_{eN}+R)/r_{eN}\}$. Here, since the resistance value R of the resistances 26 and 27 is a positive value, the coefficient $\{2(r_{eN}+R)/r_{eN}\}$ is greater than 2. To change the resistance value seen from the input terminals 29 and 30, meanwhile, the voltage value of the variable voltage source $V_3$ is changed and the collector current $I_x$ of the transistor $Q_{21}$ is changed, thereby varying vary the differential emitter resistance $r_{ep}$.

According to the embodiment shown in FIG. 10, as compared with the variation width of the differential emitter resistance $r_{ep}$, the resistance value can be varied in a by more than twice the range.

In the embodiment shown in FIG. 10, meanwhile, the collector of the transistor $Q_3$ is connected to the base of the transistor $Q_2$, and the collector of the transistor $Q_4$ is connected to the base of the transistor $Q_1$, but instead the collectors of the transistors $Q_3$ and $Q_4$ may be mutually exchanged. In this case, as the resistance value seen from the input terminals 29 and 30, a negative resistance may be realized. Moreover, in the embodiment in FIG. 10, the transistors $Q_9$ and $Q_{10}$ are used as the resistive load of the transistors $Q_1$ and $Q_2$, but it is also possible, needless to say, to use an ordinary resistance element as shown in FIG. 2.

Thus, according to the embodiment shown in FIG. 10, the resistance value can be changed in a broader range than the variation of the differential emitter resistance of a transistor, and the variable range of the resistance value can be freely changed by changing the current value of the current source connected to the transistor pair of the differential amplifier circuit.

Figure 11:
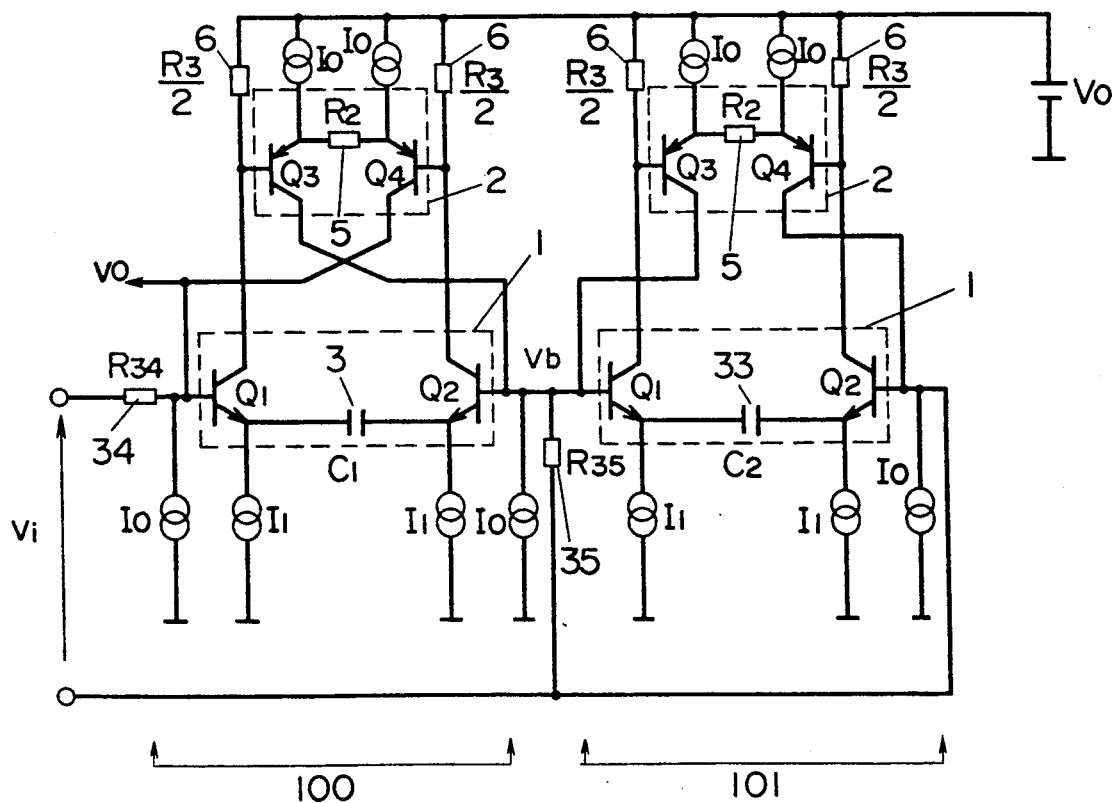
FIG. 11 is a circuit diagram expressing a variable impedance circuit in an eighth embodiment of the invention by both an AC circuit and DC circuit.
Figure 12:
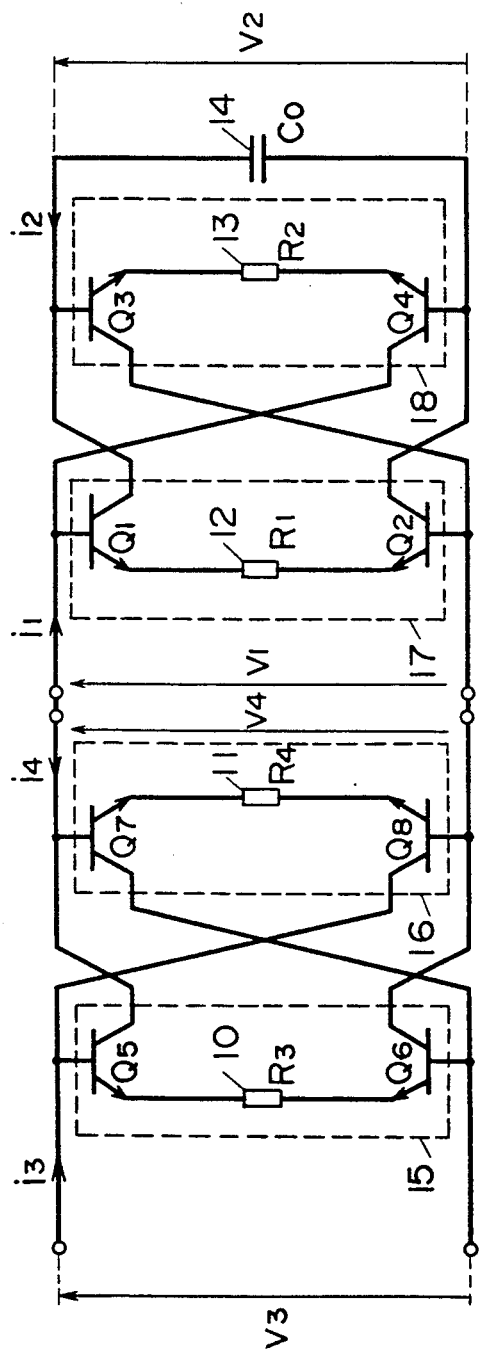
FIG. 12 is a circuit diagram expressing a conventional variable capacity circuit only by an AC circuit.
Figure 13:
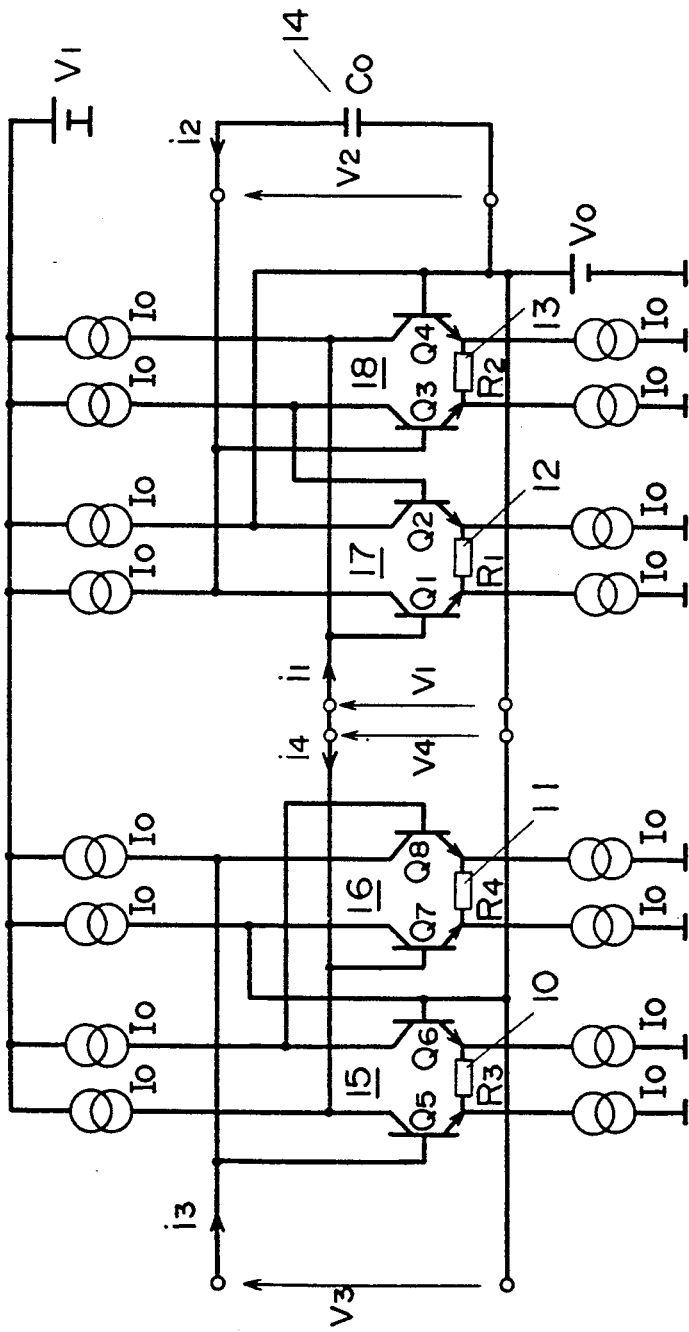
FIG. 13 is a circuit diagram expressing the conventional variable capacity circuit shown in FIG. 12 by both an AC circuit and DC circuit.
Figure 14:
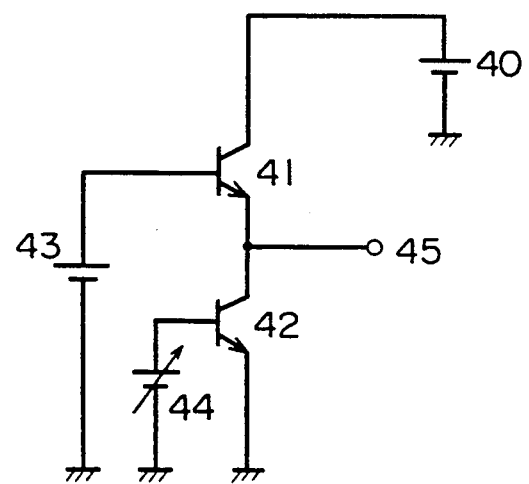
FIG. 14 is a circuit diagram showing a conventional variable resistance circuit.

FIG. 11 relates to an eighth embodiment of the invention. In FIG. 11, variable capacitance circuits 100, 101, substantially equivalent to the composition shown in FIG. 2, are connected in cascade. A capacitance element 33 is connected between the emitters of the transistors $Q_1$, $Q_2$ for composing the differential amplifier circuit 1 of the variable capacitance circuit 101. The capacitance value of this capacitance element 33 is supposed to be $C_2$. The resistance value of the resistance element 34 connected to the base of the transistor $Q_1$ of the variable capacitance circuit 100 is supposed to be $R_{34}$, and the resistance value of the resistance element 35 connected between the reference potential and the base of the transistor $Q_2$ of the variable capacitance circuit 100 is supposed to be $R_{35}$. The rest of the composition is the same as in FIG. 2.

This embodiment is intended to obtain a large (infinite, theoretically) capacitance on the basis of the following principle.

Supposing the capacitance values of two capacitance elements to be $-C_A$, $C_B$, and the synthetic capacitance by connecting them in series to be C, the following relation is obtained.

$$\frac{1}{j\omega C} = -\frac{1}{j\omega C_A} + \frac{1}{j\omega C_B} = \frac{1}{j\omega \frac{C_A \cdot C_B}{C_A - C_B}} \quad (42)$$

Therefore, it follows that $$C = \frac{C_A \cdot C_B}{C_A - C_B} \quad (43)$$

and when $C_A = C_B$, C is infinite. Generally, in a semiconductor integrated circuit, since the relative precision of elements is extremely high, when the circuit is designed so that, for example, $C_A = 1.01 \, C_B$, C is $$C = \frac{1.01 \, C_B^2}{0.01 \, C_B} = 101 \, C_B \quad (44)$$

and a capacitance value of over 100 times will be easily capacitance obtained. By the same principle, a negative capacitance may be realized.

Next, according to the composition shown in FIG. 11, its operation is explained below.

Supposing the base AC voltage of the transistor $Q_1$ of the variable capacitance circuit 100 to be $V_o$, and the base AC voltage of the transistor $Q_2$ to be $V_b$, they are $$V_o = V_i - j\omega C_1 R_{34} \cdot \frac{\frac{R_3}{2} + \frac{R_3}{2}}{R_2} (V_o - V_b) \quad (45)$$

$$V_b = j\omega C_1 R_{35} \cdot \frac{\frac{R_3}{2} + \frac{R_3}{2}}{R_2} (V_o - V_b) + $$

$$j\omega C_2 R_{35} \cdot \frac{\frac{R_3}{2} + \frac{R_3}{2}}{R_2} \cdot V_b \quad (46)$$

Here, assuming the two variable capacitance circuits 100, 101 to be symmetrical, and $R_2 = R_3$, from equations (45), (46), it follows that $$V_b = \frac{j\omega C_1 R_{35}}{1 + j\omega(C_1 - C_2)R_{35}} V_o \quad (47)$$

Putting equation (47) into equation (45) yields $$V_o = \frac{1 + j\omega(C_1 - C_2)R_{35}}{1 + j\omega(C_1 - C_2)R_{35} - \omega^2 C_1 C_2 R_{34} R_{35}} V_i \quad (48)$$

From equation (48), it is found that $$f_o = \frac{1}{2\pi \sqrt{C_1 C_2 R_{34} R_{35}}} \quad (49)$$

$$Q = \frac{1}{\sqrt{\frac{1}{C_1 C_2} \cdot \frac{R_{35}}{R_{34}}} \cdot (C_1 - C_2)} \quad (50)$$

Therefore, when $C_1 = C_2$, Q is infinite, and a secondary low pass filter with an extremely high selectivity will be realized.

On the other hand, when the resistance value $R_{35}$ is an extremely large value, it results in $$V_o = \frac{\frac{1}{R_{35}} + j\omega(C_1 - C_2)}{\frac{1}{R_{35}} + j\omega(C_1 - C_2) + (j\omega)^2 C_1 C_2 R_{34}} V_i \quad (51)$$

$$= \frac{1}{1 + j\omega \frac{C_1 \cdot C_2}{C_1 - C_2} R_{34}} V_i$$

Hence, when $C_1 = C_2$, a primary low pass filter having 35 equivalently an extremly large capacitance value $$C = \frac{C_1 \cdot C_2}{C_1 - C_2}$$

may be realized.

Along with the advancement in the degree of integration of the semiconductor integrated circuit, it is demanded to incorporate external parts, in particular, capacitance elements with large capacitance value into a semiconductor chip. Generally, in a semiconductor integrated circuit, the relative precision of elements, such as capacitors, resistors and transistors is extremely high, and therefore it is quite easy to set the capacitance values $C_1$, $C_2$ of the two capacitance elements 3 and 33 in FIG. 11 nearly equal to each other (for example, $C_1 = 1.01 \, C_2$). Therefore, hitherto, within the semiconductor chip, it was bound to realize a capacitance value of only about 100 pF from an economical point of view, while, by contrast, in the composition as shown in FIG. 11, an extremely large capacitance value may be realized in a semiconductor integrated circuit.

We claim:

1. A variable impedance circuit comprising:
   a first differential amplifier circuit having an input terminal pair, an output terminal pair and impedance element connected between emitters of a transistor pair;
   a second differential amplifier circuit having an input terminal pair and an output terminal pair;
   means for connecting said output terminal pair of said first differential amplifier circuit to said input terminal pair of said second differential amplifier circuit;
   means for connecting said output terminal pair of said second differential amplifier circuit to said input terminal pair of said first differential amplifier circuit; and,
   a resistance element connected between said input terminal pair of said second differential amplifier circuit.

2. A circuit as recited in claim 1, said impedance element being a capacitive element.

3. A circuit as recited in claim 2, further comprising a resistive element connected between emitters of a transistor pair of said second differential amplifier circuit.

4. A circuit as recited in claim 1, further comprising a resistive element connected between emitters of a transistor pair of said second differential amplifier circuit.

5. A variable impedance circuit comprising:
a first differential amplifier circuit having an input terminal pair, an output terminal pair and an impedance element connected between emitters of a transistor pair;
a second differential amplifier circuit having an input terminal pair and an output terminal pair;
means for connecting said output terminal pair of said first differential amplifier circuit to said input terminal pair of said second differential amplifier circuit;
means for connecting said output terminal pair of said second differential amplifier circuit to said input terminal pair of said first differential amplifier circuit; and,
a resistance element connected between said input terminal pair of said first differential amplifier circuit.

6. A circuit as recited in claim 5, said impedance element being a capacitive element.

7. A circuit as recited in claim 6, further comprising a resistive element connected between emitters of a transistor pair of said second differential amplifier circuit.

8. A circuit as recited in claim 5, further comprising a resistive element connected between emitters of a transistor pair of said second differential amplifier circuit.

9. A variable impedance circuit comprising:
a first differential amplifier circuit having an input terminal pair, an output terminal pair and an impedance element connected between emitters of a transistor pair;
a second differential amplifier circuit having an input terminal pair and an output terminal pair;
means for connecting said output terminal pair of said first differential amplifier circuit to said input terminal pair of said second differential amplifier circuit;
means for connecting said output terminal pair of said second differential amplifier circuit to said input terminal pair of said first differential amplifier circuit; and,
said impedance element being a capacitive element.

10. A circuit as recited in claim 9, further comprising a resistive element connected between emitters of a transistor pair of said second differential amplifier circuit.

11. A variable impedance circuit comprising:
a first differential amplifier circuit having an input terminal pair, an output terminal pair and an impedance element connected between emitters of a transistor pair;
a second differential amplifier circuit having an input terminal pair and an output terminal pair;
first means for connecting said output terminal pair of said first differential amplifier circuit to said input terminal pair of said second differential amplifier circuit;
second means for connecting said output terminal pair of said second differential amplifier circuit to said input terminal pair of said first differential amplifier circuit; and,
said second means including a current-current circuit comprising (a) a third differential amplifier circuit having an output terminal pair connected to said input terminal pair of said first differential amplifier and an input terminal pair connected to said output terminal pair of said second differential amplifier, (b) a constant current source connected to a common emitter of said third differential amplifier circuit, and (c) a transistor pair respectively connected between each of said output terminal pair of said second differential amplifier and a reference potential.

12. A variable impedance circuit comprising:
a first differential amplifier circuit having an input terminal pair, an output terminal pair and an impedance element connected between emitters of a first transistor pair;
a second differential amplifier circuit having an input terminal pair and an output terminal pair and a second transistor pair;
means for connecting said output terminal pair of said first differential amplifier circuit to said input terminal pair of said second differential amplifier circuit;
means for connecting said output terminal pair of said second differential amplifier circuit to said input terminal pair of said first differential amplifier circuit;
a constant current source connected between a common emitter of said second transistor pair of said second differential amplifier circuit and a first voltage source;
a third transistor pair respectively connected between each input terminal pair of said second differential amplifier circuit and said first voltage source; and,
a second voltage source being connected as a base bias to each of said third transistor pair.

13. A variable impedance circuit comprising:
a first differential amplifier circuit having an input terminal pair, an output terminal pair and a first impedance element connected between emitters of a transistor pair;
a second differential amplifier circuit having an input terminal pair and an output terminal pair;
means for connecting said output terminal pair of said first differential amplifier circuit to said input terminal pair of said second differential amplifier circuit;
means for connecting said output terminal pair of said second differential amplifier circuit to said input terminal pair of said first differential amplifier circuit;
a third differential amplifier circuit having an input terminal pair, an output terminal pair and an impedance element connected between emitters of a transistor pair;
a fourth differential amplifier circuit having an input terminal pair and an output terminal pair;
means for connecting said output terminal pair of said third differential amplifier circuit to said input terminal pair of said fourth differential amplifier circuit;
means for connecting said output terminal pair of said fourth differential amplifier circuit to said input terminal pair of said third differential amplifier circuit; and,
means for connecting one of said input terminal pair of said first differential amplifier circuit to one of said input terminal pair of said third differential amplifier circuit.

* * * * *